(12) United States Patent
Schmitt et al.

(10) Patent No.: US 6,300,800 B1
(45) Date of Patent: Oct. 9, 2001

(54) INTEGRATED CIRCUIT I/O BUFFER WITH SERIES P-CHANNEL AND FLOATING WELL

(75) Inventors: Jonathan A. Schmitt, Eden Prairie; Eric W. Eklund, Lakeville, both of MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/448,307

(22) Filed: Nov. 24, 1999

(51) Int. Cl.[7] .................. H03K 19/094; H03K 19/02
(52) U.S. Cl. .................................. 326/86; 326/57
(58) Field of Search .................. 326/86, 87, 83, 326/85, 80, 81, 56, 57

(56) References Cited

U.S. PATENT DOCUMENTS

| | | | |
|---|---|---|---|
| 4,123,671 | 10/1978 | Aihara et al. | 307/270 |
| 4,479,067 | 10/1984 | Fujita | 307/475 |
| 4,495,429 | 1/1985 | Oda et al. | 307/491 |
| 4,583,203 | 4/1986 | Monk | 365/189 |
| 4,631,426 | 12/1986 | Nelson et al. | 307/450 |
| 4,972,517 | 11/1990 | Kondou et al. | 307/270 |
| 4,978,633 | 12/1990 | Seefeldt et al. | 437/51 |
| 5,001,487 | 3/1991 | Suzuki et al. | 357/43 |
| 5,003,204 | 3/1991 | Cushing et al. | 307/465 |
| 5,128,560 | 7/1992 | Chern et al. | 307/475 |
| 5,266,849 | 11/1993 | Kitahara et al. | 307/475 |
| 5,300,832 | 4/1994 | Rogers | 307/475 |
| 5,321,324 | 6/1994 | Hardee et al. | 307/475 |
| 5,338,978 | 8/1994 | Larsen et al. | 307/443 |
| 5,381,059 | 1/1995 | Douglas | 326/58 |
| 5,381,062 | 1/1995 | Morris | 326/68 |
| 5,396,128 | * 3/1995 | Dunning et al. | 326/68 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |

(List continued on next page.)

FOREIGN PATENT DOCUMENTS 520 470 A2 * 12/1992 (EP).

OTHER PUBLICATIONS

Sedra et al., "Microelectronic Circuits & Devices", Prentice Hall, p. 343.

*Primary Examiner*—Michael Tokar
*Assistant Examiner*—James H. Cho

(57) ABSTRACT

An integrated circuit output buffer includes a core terminal, a pad terminal, a pad pull-up transistor, a pad pull-down transistor, a pull-up voltage protection transistor, and a selectively conductive pad voltage feedback path. The pad pull-up transistor and the pad pull-down transistor are coupled to the pad terminal and are biased to respectively charge and discharge the pad terminal in response to a data signal received on the core terminal. The pull-up voltage protection transistor is coupled in series between the pad pull-up transistor and the pad terminal and has a control terminal and a well terminal. The selectively conductive pad voltage feedback path is coupled between the pad terminal and the well terminal of the pull-up voltage protection transistor.

15 Claims, 2 Drawing Sheets

U.S. PATENT DOCUMENTS

| | | | |
|---|---|---|---|
| 5,465,069 | 11/1995 | Boiron et al. | 327/333 |
| 5,467,031 | 11/1995 | Nguyen et al. | 326/81 |
| 5,512,844 | 4/1996 | Nakakura et al. | 326/81 |
| 5,532,620 | 7/1996 | Seo et al. | 326/81 |
| 5,537,059 | 7/1996 | Asahina | 326/81 |
| 5,541,534 | 7/1996 | Cao et al. | 326/81 |
| 5,559,464 | 9/1996 | Orii et al. | 327/333 |
| 5,646,550 | 7/1997 | Campbell et al. | 326/81 |
| 5,663,663 | 9/1997 | Cao et al. | 326/81 |
| 5,723,987 | 3/1998 | Ronen | 326/81 |
| 5,736,869 | 4/1998 | Wei | 326/81 |
| 5,844,425 | 12/1998 | Nguyen et al. | 326/58 |
| 5,864,243 | 1/1999 | Chen et al. | 326/58 |
| 5,880,602 | 3/1999 | Kaminaga et al. | 326/81 |
| 5,883,538 | 3/1999 | Keeth et al. | 327/333 |
| 5,900,750 | 5/1999 | Schmitt | 327/108 |
| 5,929,667 | 7/1999 | Abadeer et al. | 327/112 |
| 5,933,025 * | 8/1999 | Nance et al. | 326/81 |
| 5,963,055 * | 10/1999 | Tanaka et al. | 326/81 |
| 5,963,057 | 10/1999 | Schmitt et al. | 326/103 |
| 5,966,030 | 10/1999 | Schmitt et al. | 326/83 |
| 6,005,413 | 12/1999 | Schmitt | 326/80 |
| 6,028,449 | 4/2000 | Schmitt | 326/80 |
| 6,060,906 * | 5/2000 | Chow et al. | 326/81 |

* cited by examiner

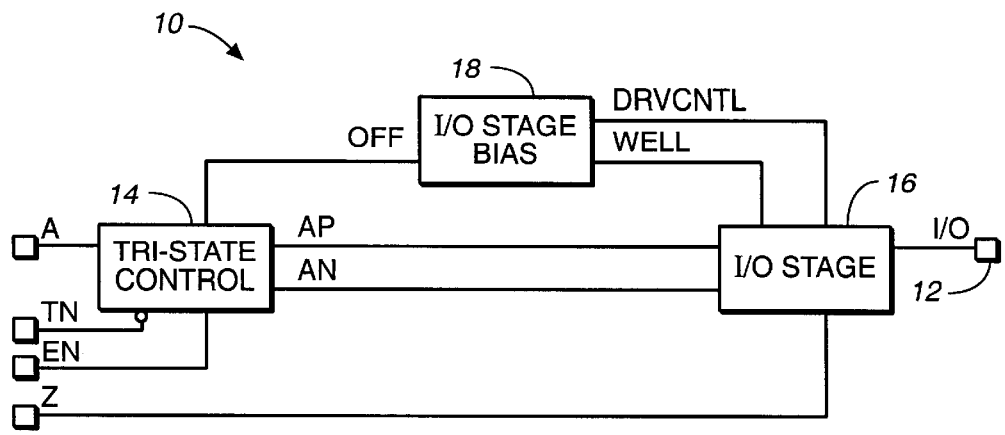
FIG._1
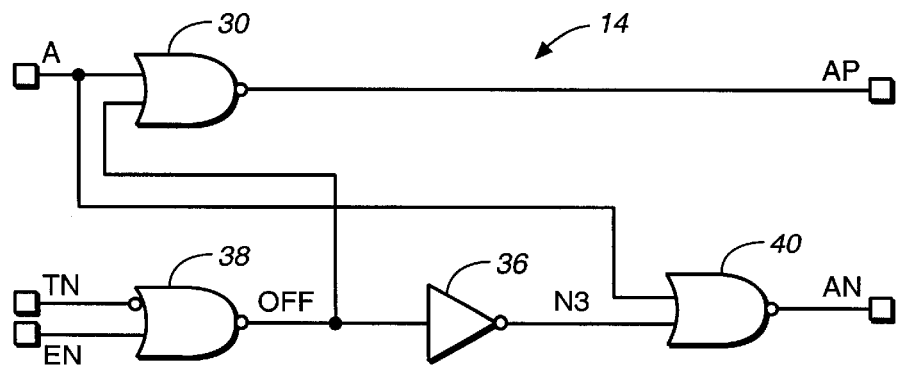
FIG._2
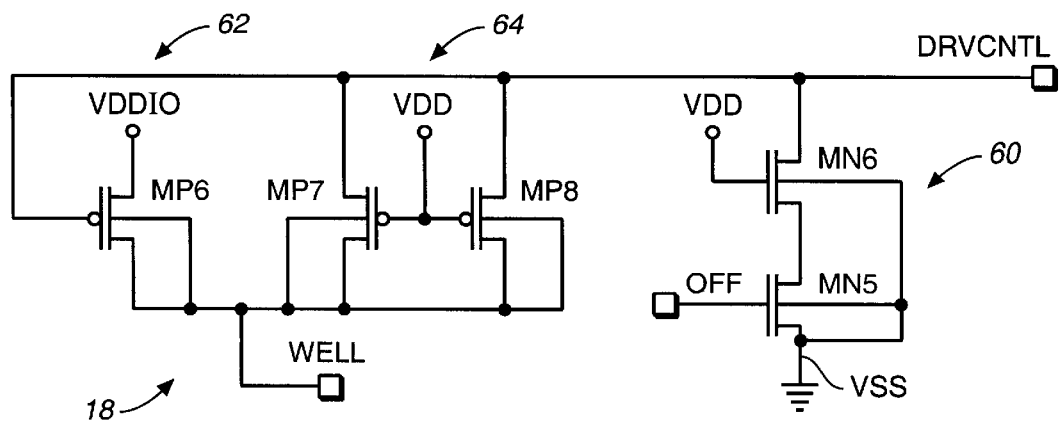
FIG._4

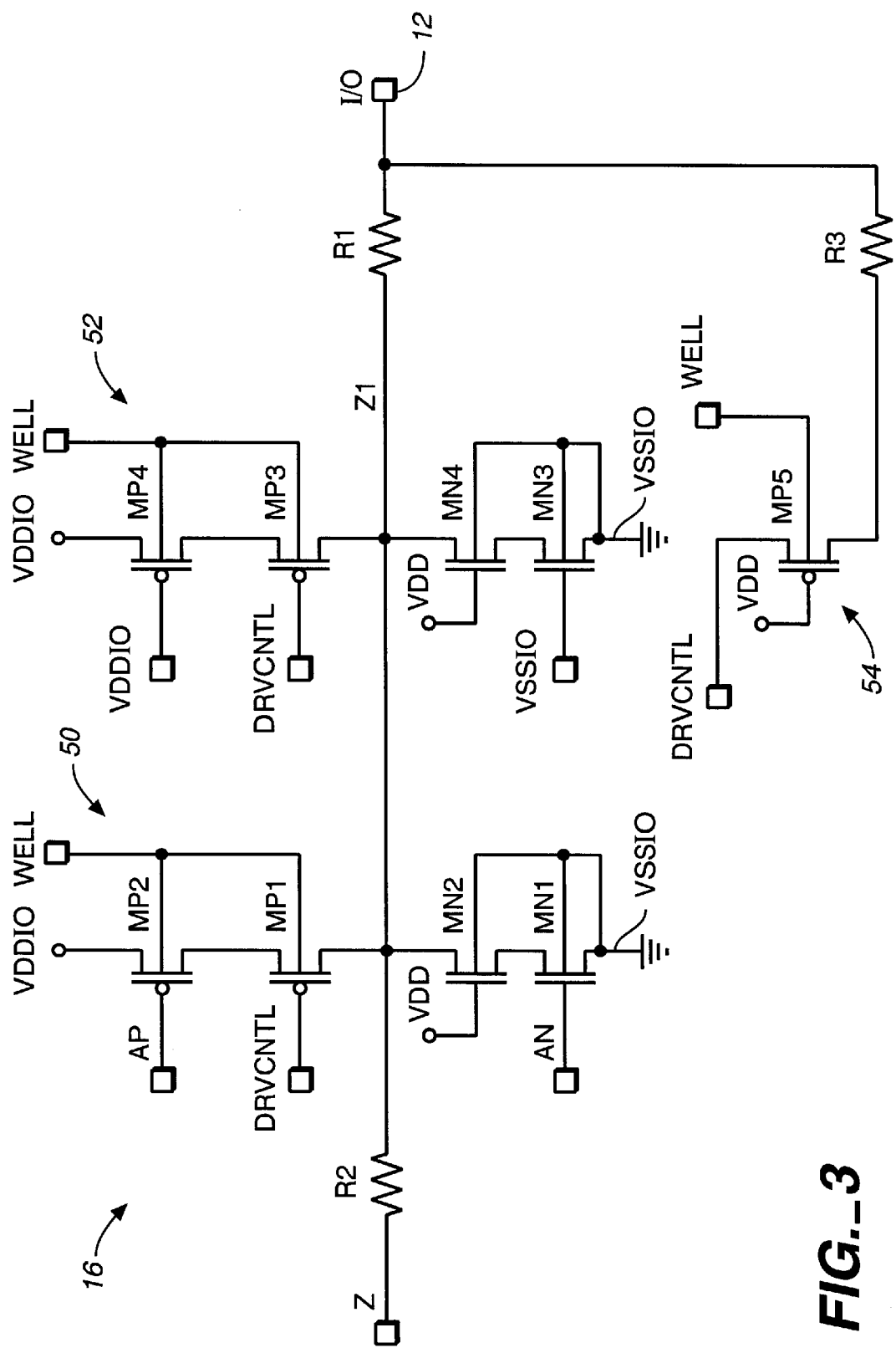
FIG._3

INTEGRATED CIRCUIT I/O BUFFER WITH
SERIES P-CHANNEL AND FLOATING WELL

CROSS-REFERENCE TO RELATED APPLICATION

Cross-reference is hereby made to co-pending U.S. application Ser. No. 09/061,972, entitled "INTEGRATED CIRCUIT I/O BUFFER HAVING PASS GATE PROTECTION WITH RC DELAY," filed Apr. 17, 1998 and issued as U.S. Pat. No. 6,118,303, and U.S. application Ser. No. 09/098,099, entitled "INTEGRATED CIRCUIT I/O BUFFER WITH 5V WELL AND PASSIVE GATE VOLTAGE," filed Jun. 16, 1998 and issued as U.S. Pat. No. 6,130,556, which are assigned to the same assignee.

BACKGROUND OF THE INVENTION

The present invention relates to semiconductor integrated circuits and, more particularly, to an input-output (I/O) buffer, which is capable of interfacing with voltages higher than its I/O voltage.

CMOS integrated circuits are typically provided with tri-state I/O buffers that are selectively operable between a low-impedance drive mode and a high-impedance, tri-state mode in which the buffers appear transparent to the output pad terminals with which they are connected. Advancements in semiconductor fabrication technology enable the geometries of semiconductor devices to be progressively reduced so that more devices can fit on a single integrated circuit. As a result, core voltages of integrated circuits are being reduced to prevent damage to the small devices and to reduce overall power consumption of the integrated circuit. For example, power supplies are now being reduced from 5V to 3.3V, from 3.3V to 2.5V, and from 2.5V to 1.8V.

However, low voltage CMOS devices are often interconnected at a board level to integrated circuits having older technology and operating at higher core voltages such as 3.3V or 5V. It is therefore desirable to provide an I/O buffer that is tolerant to pad voltages that are larger than the I/O voltage without exceeding the tolerance levels of the devices within the buffer and without drawing leakage current from the pad terminal while in the tri-state mode.

SUMMARY OF THE INVENTION

The integrated circuit output buffer of the present invention includes a core terminal, a pad terminal, a pad pull-up transistor, a pad pull-down transistor, a pull-up voltage protection transistor, and a selectively conductive pad voltage feedback path. The pad pull-up transistor and the pad pull-down transistor are coupled to the pad terminal and are biased to respectively charge and discharge the pad terminal in response to a data signal received on the core terminal. The pull-up voltage protection transistor is coupled in series between the pad pull-up transistor and the pad terminal and has a control terminal and a well terminal. The selectively conductive pad voltage feedback path is coupled between the pad terminal and the well terminal of the pull-up voltage protection transistor.

Another aspect of the present invention relates to a method of operating a tri-state buffer having a pad pull-down transistor, which is coupled to a pad terminal, and a pad pull-up transistor, which is coupled to the pad terminal through a pull-up voltage protection transistor. The method includes: operating the tri-state buffer in a low-impedance drive mode in which the pad pull-down transistor and the pad pull-up transistor are biased to selectively couple the pad terminal to a ground supply terminal and a power supply voltage, respectively; operating the tri-state buffer in a high-impedance, tri-state mode in which the pad pull-up and pad pull-down transistors are biased in an off state; coupling a voltage on the pad terminal to a well terminal of the pull-up voltage protection transistor through a feedback path when the tri-state buffer is in the high-impedance, tri-state mode and the voltage on the pad terminal exceeds a selected voltage level; and decoupling the voltage in the pad terminal from the well terminal of the pull-up voltage protection transistor through the feedback path when the tri-state buffer is in the high-impedance, tri-state mode and the voltage on the pad terminal is less than the selected voltage level.

Another aspect of the present invention relates to a method of maintaining an output driver stage of a tri-state buffer in a high-impedance tri-state mode when the voltage on the pad terminal of the buffer exceeds a selected voltage. The outputs driver stage includes a pad pull-up transistor which is coupled to the pad terminal in series with a pull-up protection transistor. The method includes: coupling the voltage on the pad terminal to a well terminal and a control terminal of the pull-up voltage protection transistor when the tri-state buffer is in the high-impedance tri-state mode and the voltage on the pad terminal exceeds the selected voltage; coupling the well terminal of the pull-up voltage protection transistor to a power supply terminal when the voltage on the pad terminal is less than the selected voltage; and coupling the control terminal of the pull-up voltage protection transistor to a ground supply terminal when the tri-state buffer is in the low-impedance drive mode.

BRIEF DESCRIPTION OF THE DRAWINGS

FIG. 1 is a simplified block diagram of a tri-state input-output (I/O) buffer according to one embodiment of the present invention.

FIG. 2 is a logic diagram of a tri-state control circuit within the I/O buffer shown in FIG. 1.

FIG. 3 is a schematic diagram of an I/O stage within the I/O buffer shown in FIG. 1.

FIG. 4 is a schematic diagram of an I/O stage bias circuit having a pad voltage feedback path within the I/O buffer shown in FIG. 1.

DETAILED DESCRIPTION OF THE PREFERRED EMBODIMENTS

FIG. 1 is a simplified block diagram of a tri-state input-output (I/O) buffer according to one embodiment of the present invention. I/O buffer 10 forms part of an integrated circuit, which has been fabricated with a 2.5V CMOS fabrication process, for example. However, other fabrication processes can also be used, such as a 1.8V or a 3.3V fabrication process. I/O buffer 10 receives a 0V–2.5V data signal from the core of the integrated circuit on core terminal A and, in response, drives a 0V–2.5V output signal on I/O pad 12. Also, I/O buffer 10 receives 0V–2.5V, 0V–3.3V or 0V–5V data signals on I/O pad 12 and supplies 0V–2.5V data signals on data terminal Z. Each transistor in I/O buffer 10 is biased such that the gate-to-source and gate-to-drain voltages are all less than a 2.5V tolerance.

I/O buffer 10 includes tri-state control circuit 14, I/O stage 16 and I/O stage bias circuit 18. Tri-state control circuit 14 is coupled to core terminal A and enable terminals TN and EN. I/O buffer 10 is enabled when enable terminal TN is high and enable terminal EN is low. I/O buffer 10 is disabled when enable terminal TN is low and enable terminal EN is high. When I/O buffer 10 is enabled, tri-state control circuit 14 generates 2.5V–0V control signals on pull-down control terminal AN and pull-up control terminal AP, which follow the complement of the data applied to core terminal A. Other voltage ranges can also be used, and the range applied to one of the AN and AP terminals can be shifted with respect to the other terminal in alternative embodiments. When I/O buffer 10 is disabled, tri-state control circuit 14 drives pull-down control terminal AN low and pull-up control terminal AP high to disable the output drive function of I/O stage 16. Tri-state control circuit 14 also generates a 0V–2.5V tri-state control signal on terminal OFF, which is provided to I/O stage bias circuit 18.

I/O stage 16 selectively pulls I/O pad 12 high substantially to 2.5V for example) in response to a 0V level con pull-up control terminal AP. I/O stage 16 selectively pulls I/O pad 12 low substantially to 0V in response to a 2.5V level on pull-down control terminal AN. When enable terminal EN is high or enable terminal TN is low, tri-state control circuit 14 drives pull-up control terminal AP high to 2.5V and pull-down control terminal. AN low to 0V, causing I/O stage 16 to operate in a high impedance mode in which the I/O stage appears transparent to I/O pad 12. When in the high-impedance mode, I/O stage 16 applies any data signals received on I/O pad 12 to core terminal Z for processing by the integrated circuit on which I/O buffer 10 is fabricated.

I/O stage bias circuit 18 generates bias voltages for the P-type transistors within I/O stage 16 based on the logic level on tri-state control terminal OFF and the voltage on I/O pad 12. When enable control terminal OFF indicates that I/O buffer 10 is in the low-impedance drive mode, I/O stage bias circuit 18 drives control node DRVCNTL to 0V and well bias node WELL to 2.5V. As shown and discussed below in more detail with respect to FIG. 3, control node DRVCNTL is coupled to the gates of the P-channel voltage protection transistors within I/O stage 16, and well bias node WELL is coupled to the wells of the P-channel transistors within I/O stage 16.

When enable control terminal OFF indicates that I/O buffer 10 is in a high-impedance tri-state mode, and if the voltage on I/O pad 12 exceeds a selected voltage, I/O stage bias circuit 18 allows DRVCNTL and WELL to rise with the pad voltage. This eliminates the possibility of any leakage current being drawn by I/O stage 16 at high pad voltages.

Tri-State Control Circuit 14

FIG. 2 is a logic diagram of tri-state control circuit 14 according to one embodiment of the present invention. Tri-state control circuit 14 includes NAND gate 30, inserter 36 and NOR gates 38 and 40. Core terminal A is coupled to one input of NAND gate 30, and the other input of NAND gate 30 is coupled to enable control terminal OFF. The output of NAND gate 30 is coupled to pull-up control terminal AP. NOR gate 38 has an active-low input coupled to enable terminal TN and an active-high input coupled to enable terminal EN. The output of NOR gate 38 is coupled to the input of inverter 36, at enable terminal OFF. The output of inverter 36 is coupled to one of the inputs of NOR gate 40, at node N3. The other input of NOR gate 40 is coupled to core data terminal A. The output of NOR gate 40 is coupled to pull-down control terminal AN.

During normal operation, enable terminal EN is low and enable terminal TN is high. Tri-state control terminal OFF is high, and the data signals applied to core terminal A are inverted and passed to terminals AP and AN. When either enable terminal EN is high or enable terminal TN is low, tri-state control terminal OFF is low, resulting in terminals AP and AN being driven to logic high and logs states, respectively.

I/O Stage 16

FIG. 3 is a schematic diagram, of I/O stage 16 according to one embodiment of the present invention. I/O stage 16 includes output driver 50, electrostatic discharge (ESD) protection circuit 52, and pad voltage feedback circuit 54. Output driver 50 includes N-channel pull-down transistor MN1, N-channel voltage protection transistor MN2, P-channel voltage protection transistor MP1 and P-channel pull-up transistor MP2. Pull-down transistor MN1 has a gate coupled to pull-down control terminal AN, a source and well coupled to voltage supply terminal VSSIO (i.e., a ground terminal), and a drain coupled to the source of voltage protection transistor MN2. Voltage protection transistor MN2 has a gate coupled to voltage supply terminal VDD (i.e., a power terminal), a well coupled to voltage supply terminal VSSIO and a drain coupled to I/O node Z1. I/O node Z1 is coupled to I/O pad 12 through a diffusion resistor R1. I/O node Z1 is coupled to core terminal Z through polysilicon resistor R2.

Pull-up voltage protection transistor MP1 has a gate coupled to control node DRVCNTL, a drain coupled to I/O node Z1, a source coupled to the drain of pull-up transistor MP2 and a well coupled to well bias node WELL. Pull-up transistor MP2 has a gate coupled to pull-up control terminal AP and a source coupled to voltage supply terminal VDDIO (i.e., a power supply terminal). A plurality of additional output drivers similar to output driver 50 can be coupled in parallel with output driver 50 to provide extra drive strength through I/O pad 12. Also, additional output drivers can be coupled in parallel with one another and connected to I/O pad 12 through a separate diffusion resistor, similar to resistor R1. For simplicity, only one output driver 50 and diffusion resistor R1 is shown in FIG. 3.

ESD protection circuit 52 includes N-channel voltage clamping transistor MN3, N-channel voltage protection transistor MN4, P-channel voltage protection transistor MP3 and P-channel voltage clamping transistor MP4. Clamping transistor MN3 has a gate, source and well coupled to voltage supply terminal VSSIO and a drain coupled to the source of voltage protection transistor MN4. Voltage protection transistor MN4 has a gate coupled to voltage supply terminal VDD, a drain coupled to I/O node Z1 and a well coupled to voltage supply terminal VSSIO. Voltage protection transistor MP3 has a gate coupled to control node DRVCNTL, a drain coupled to I/O node Z1, a source coupled to the drain of clamping transistor MP4 and a well coupled to well bias node WELL. Clamping transistor MP4 has a gate and source coupled to voltage supply terminal VDDIO and a well coupled to well bias node WELL.

As mentioned above, I/O stage bias circuit 18 drives substrate bias node WELL to about 2.5V and drives control node DRVCNTL to about 0V when I/O buffer 10 is in the low-impedance drive mode. The low voltage on control node DRVCNTL turns an voltage protection transistors MP1 and MP3. Voltage protection transistors MN2 and MN4 are also on since their gates are tied to VDD. The pull-down and pull-up control signals received on terminals AN and AP cause transistors MN1 and MP2 to pull I/O pad 12 down substantially to 0V or up substantially to 2.5V, depending on the logic state of the data signal received on data terminal A (shown in FIGS. 1–2). When terminals AN and AP go low, pull-down transistor MN1 turns off and pull-up transistor MP2 turns on and charges I/O node Z1 through voltage protection transistor MP1. When terminals AN and AP go high, pull-up transistor MP2 turns off and pull-down transistor MN1 turns on and discharges I/O node Z1 through voltage protection transistor MN2.

When buffer 10 is in the high-impedance tri-state mode, tri-state control circuit 14 (shown in FIG. 2) drives pull-down control terminal AN to 0V and pull-up control terminal AP to 2.5V. Transistors MN1 and MP2 turn off to isolate I/O pad 12 from output driver 50. Any data signals received on I/O pad 12 are transmitted through resistors R1 and R2 to core terminal Z.

ESD protection circuit 52 assists in protecting the transistors in I/O buffer 10 from external ESD events. For negative-going voltage spikes, clamping transistor MN3 turns on when the voltage on I/O node Z1 goes below VSSIO to clamp the node at about VSSIO. For positive going voltage spikes, the gate of voltage protection transistor MP3 is allowed to rise with the pad voltage, therefore MP3 remains off and prevents clamping transistor MP4 from clamping the voltage. However, P-channel devices MP3 and MP4 in ESD protection circuit 52 assist in charge device model ESD protection and maintain symmetry in the metal routing pattern within I/O buffer 10. Additional ESD protection circuits can be coupled in parallel with ESD protection circuit 52. For simplicity, only one circuit is shown in FIG. 3. In an alternative embodiment. ESD protection circuit 52 is removed.

Pad voltage feedback circuit 54 forms a selectively conductive feedback path from I/O pad 12 to control node DRVCNTL and the gates of voltage protection transistors MP1 and MP3. Pad voltage feedback circuit 54 includes P-channel pass-gate transistor MP5, which is coupled in series with I/O pad 12 through diffusion resistor R3. Pass-gate transistor MP5 has a gate coupled to voltage supply terminal VDD, a source coupled to diffusion resistor R3, a drain coupled to control node DRVCNTL and a well coupled to well bias node WELL. When the voltage on I/O pad 12 rises to a gate-source threshold voltage above VDD, pass-gate translator MP5 turns on, feeding the pad voltage back to control node DRVCNTL. When in the tri-state mode, I/O bias circuit 18 floats control node DRVCNTL to an undetermined voltage. This allows control node DRVCNTL and thus the gates of voltage protection transistors MP1 and MP3 to rise with the pad voltage, ensuring that these transistors remain off at high pad voltages. These transistors therefore do not pull any DC current when the pad voltage rises above the core voltage of I/O buffer 10.

Once again, additional P-channel pass-gate transistors can be coupled in parallel with transistor MP5. Also, additional pull-down driver circuits similar to transistors MN1 and MN2 and additional pull-down ESD protection circuits similar to transistors MN3 and MN4 can be coupled to the node between resistor R3 and the source of transistor MP5. These circuits can take advantage of additional transistors already present in a typical layout pattern.

I/O Stage Bias Circuit 18

FIG. 4 is a schematic diagram illustrating I/O bias circuit 18 in greater detail, according to one embodiment of the present invention. I/O stage bias circuit 18 includes a bias circuit 60 for driving the gates of voltage protection transistors MP1 and MP3, a well bias circuit 62 for driving the wells of the P-channel transistors in I/O stage 16 and a pad voltage feedback circuit 64 for feeding the pad voltage back to well bias node WELL. Bias circuit 60 includes N-channel pull-down transistor MN5 and N-channel hot electron carrier protection transistor MN6. Pull-down transistor MN5 has a gate coupled to tri-state control terminal OFF, a source and well coupled to voltage supply terminal VSS (i.e. a ground terminal) and a drain coupled to the source of protection transistor MN6. Protection transistor MN6 has a gate coupled to voltage supply terminal VDD, a drain coupled to control node DRVCNTL and a well coupled to voltage supply terminal VSS. Additional bias circuits, similar to bias circuit 60, can be coupled in parallel with bias circuit 60. For simplicity, only one bias circuit 60 is shown in FIG. 4.

During regular operation when buffer 10 is in the low-impedance drive mode, tri-state control terminal OFF is high. Pull-down transistor MN5 is on and pulls control node DRVCNTL low to about 0V through protection transistor MN6, which is normally on since its gate is tied to VDD. With control node DRVCNTL at 0V, voltage protection transistors MP1 and MP2 (shown in FIG. 3) are on and allow pull-up transistors MP2 and MP4 to control the charging and discharging of I/O node Z1.

When I/O buffer 10 is in the high-impedance tri-state mode, tri-state control terminal OFF is low and turns pull-down transistor MN5 off. With pull-down transistor MN5 off, control node DRVCNTL and thus the gates of voltage protection transistors MP1 and MP3 are floated to an undetermined voltage. This allows pass-gate transistor MP5 (shown in FIG. 3) to drive control node DRVCNTL and the gates of transistors MP1 and MP3 when the pad voltage exceeds a gate-source threshold voltage above voltage supply terminal VDD. When control node DRVCNTL, is driven to a high voltage, hot electron protection transistor MN6 limits the drain-source voltages seen by transistors MNS and MN6, which prevents a hot electron effect in which transistors MN5 and MN6 would otherwise draw current from node DRVCNTL.

Well bias circuit 62 includes P-channel bias transistor MP6, which has a gate coupled to control node DRVCNTL, a source coupled to voltage supply terminal VDDIO and a drain and well coupled to well bias node WELL. During regular operation, when control node DRVCNTL is pulled low through bias circuit 60, well bias transistor MP6 is on and drives well bias terminal WELL to voltage supply terminal VDDIO. During the high-impedance tri-state mode, when the pad voltage exceeds the core supply voltage, pass-gate transistor MP5 (shown in FIG. 3) turns on, feeding the pad voltage to control node DRVCNTL. Since the voltage on control node DRVCNTL is now greater than the core supply voltage, well bias transistor MP6 turns off, floating well bias terminal WELL to an undetermined voltage. This allows pad voltage feedback circuit 64 to feed the voltage on control node DRVCNTL (i.e. the pad voltage) back to well bias node WELL.

Pad voltage feedback circuit 64, together with pad voltage feedback circuit 54 (shown in FIG. 3), forms a selectively conductive feedback path from I/O pad 12 to welt bias node WELL. Pad voltage feedback circuit 64 includes P-channel pass-gate transistors MP7 and MP8, which are coupled in parallel with one another. Pass-gate transistors MP7 and MP8 each have a gate coupled Lo voltage supply terminal VDD, a source coupled to control node DRVCNTL and a drain and well coupled to well bias node WELL. In an alternative embodiment, the sources of pass-gate transistors MP7 and MP8 are coupled directly to I/O pad 12, through a diffusion resistor, similar to resistor R1 shown in FIG. 3. In another alternative embodiment, the gates of pass-gate transistors MP7 and MP8 are coupled to voltage supply terminal VDDIO. When the voltage on control node DRVCNTL exceeds the core supply voltage, pass-gate transistors MP7 and MP8 turn on, feeding the pad voltage back to well bias node WELL. This allows the wells of the P-channel transistors in I/O stage 16 to rise with the voltage on I/O pad 12, thus preventing a drain-to-well (or drain-to-bulk) NP junction diode that would otherwise draw current from I/O pad 12 when the pad voltage rises above the core voltage.

In summary, I/O buffer 10 is capable of interfacing with voltages greater than the supply voltage at which the buffer operates without drawing leakage current through the P-type devices in the buffer. This allows the buffer to be used in a wide variety of applications in which the buffer may be required to interface with devices having higher core voltages.

In alternative embodiments, I/O buffer 10 can be adapted to drive voltages through I/O pad 12 that are higher than the core voltage levels. In these embodiments, I/O buffer 10 can be modified to include voltage level shifting circuits (not shown), which adapt buffer 10 to drive 0V–3.3V output signal or a 0V–5.0V output signal, for example, through I/O pad 12 even though the supplied voltage level of the chip is only 2.5V. The voltage level applied to voltage supply, terminal VDDIO can be Increased relative to voltage supply terminal VDD in order to provide a greater output swing. Examples of suitable voltage level shifting circuits are described in Schmitt U.S. Pat. No. 5,900,750, which is entitled "5V OUTPUT DRIVER ON 2.5V TECHNOLOGY", and Schmitt et al. U.S. Pat. No. 5,966,030, entitled "OUTPUT BUFFER WITH REGULATED VOLTAGE BIASING FOR DRIVING VOLTAGES GREATER THAN TRANSISTOR TOLERANCE." Other voltage level shifting circuits can also be used.

Although the present invention has been described with reference to preferred embodiments, workers skilled in the art will recognize that changes may be made in form and detail without departing from the spirit and scope of the invention. For example, the present invention can be implemented with various technologies, including CMOS, and can have a variety of circuit configurations. The terms "source" and "drain" as used in the specification and claims are interchangeable. The transistors shown in the figures can include individual transistors or an array of transistors coupled together in parallel with one another. The voltage supply terminals can be relatively positive or relatively negative, depending upon the particular convention adopted and the technology used and can include a power supply bus or a biased reference terminal having a voltage other than that of the power supply buses, for example. The term "power terminal" and the term "ground terminal" can each refer to a single voltage supply terminal or a number of different supply terminals having one or more different voltage levels. The terms "pull-up" and "pull-down" used in the specification and the claims are arbitrary terms and can refer either to a logic high level or a logic low level depending upon the relative levels of the voltage supply terminals. Likewise, the term "coupled" can include various types of connections or couplings and can include a direct connection or a connection through one or more intermediate components.

What is claimed is:

1. An integrated circuit output buffer comprising:
   a core terminal;
   a pad terminal;
   a first power supply terminal;
   a ground supply terminal;
   a pad pull-up transistor and a pad pull-down transistor which are coupled to the pad terminal and biased to respectively charge and discharge the pad terminal in response to data received on the core terminal;
   a pull-up voltage protection transistor coupled in series between the pad pull-up transistor and the pad terminal and having a control terminal and a well terminal; and
   a first selectively conductive voltage feedback path coupled between the pad terminal and the well terminal of the pull-up voltage protection transistor and comprising: first and second P-channel pass-gate transistors coupled in series with one another between the pad terminal and the well terminal and each having a control terminal coupled to the first power supply terminal.

2. The integrated circuit output buffer of claim 1 wherein:
   the pad pull-up transistor has a well terminal, which is coupled to the well terminal of the pull-up voltage protection transistor.

3. The integrated circuit output buffer of claim 1 and further comprising:
   a second power supply terminal; and
   well bias circuit means for coupling the well terminal to the second power supply terminal when a voltage on the pad terminal is less than a selected voltage level and for floating the well terminal to an undetermined voltage when the voltage on the pad terminal exceeds the selected voltage level.

4. The integrated circuit output buffer of claim 3 wherein:
   the well bias circuit means comprises a bias transistor coupled in series between the second power supply terminal and the well terminal and having a control terminal coupled to a control node located at an electrical connection between the first and second pass-gate transistors.

5. The integrated circuit output buffer of claim 4 wherein the control node is coupled to the control terminal of the pull-up voltage protection transistor.

6. The integrated circuit output buffer of claim 1 and further comprising:
   a low-impedance drive mode and a high-impedance tri-state mode; and
   bias circuit means for coupling the control terminal of the pull-up voltage protection transistor to the ground supply terminal when the buffer is in the low-impedance drive mode and for decoupling the control terminal of the pull-up voltage protection transistor from the ground supply terminal when the buffer is in the high-impedance tri-state mode.

7. The integrated circuit output buffer of claim 6 and further comprising:
   a tri-state control terminal having an active state for placing the buffer in the drive state and an inactive state for placing the buffer in the high impedance state; and
   wherein the bias circuit means comprises an N-channel pull-down bias transistor coupled in series between the control terminal of the pull-up voltage protection transistor and the ground supply terminal and having a control terminal coupled to the tri-state control terminal.

8. The integrated circuit output buffer of claim 1 and further comprising:
   a second selectively conductive voltage feedback path coupled between the pad terminal and the control terminal of the pull-up voltage protective transistor.

9. The integrated circuit output buffer of claim 1 wherein the second selectively conductive voltage feedback path comprises the first P-channel pass-gate transistor, which is coupled in series between the pad terminal and the control terminal of the pull-up voltage protection transistor.

10. A method of operating a tri-state buffer having a pad pull-down transistor, which is coupled to a pad terminal, and a pad pull-up transistor, which is coupled to the pad terminal through a pull-up voltage protection transistor, the method comprising:

- operating the tri-state buffer in a low-impedance drive mode in which the pad pull-down transistor and the pad pull-up transistor are biased to selectively couple the pad terminal to a ground supply terminal and a power supply voltage, respectively;
- operating the tri-state buffer in a high-impedance, tri-state mode in which the pad pull-up and pad pull-down transistors are biased in an off state;
- coupling a voltage on the pad terminal to a well terminal of the pull-up voltage protection transistor through a feedback path comprising first and second P-channel pass-gate transistors, which are coupled in series with one another between the pad terminal and the well terminal and each have a control terminal coupled to the power supply terminal, when the tri-state buffer is in the high-impedance, tri-state mode and the voltage on the pad terminal exceeds a selected voltage level; and
- decoupling the voltage on the pad terminal from the well terminal of the pull-up voltage protection transistor through the feedback path when the tri-state buffer is in the high-impedance, tri-state mode and the voltage on the pad terminal is less than the selected voltage level.

11. The method of claim 10 and further comprising:
coupling the well terminal of the pull-up voltage protection terminal to the power supply terminal when the voltage on the pad terminal is less than the selected voltage level.

12. The method of claim 10 and further comprising:
coupling the voltage on the pad terminal to a control terminal of the pull-up voltage protection transistor through the first P-channel pass gate transistor in the feedback path, which is coupled in series between the pad terminal and the control terminal of the pull-up voltage protection transistor, when the tri-state buffer is in the high-impedance, tri-state mode and the voltage on the pad terminal exceeds the selected voltage level; and decoupling the voltage on the pad terminal from the control terminal of the pull-up voltage protection transistor through the feedback path when the tri-state buffer is in the high-impedance, tri-state mode and the voltage on the pad terminal is less than the selected voltage level.

13. The method of claim 12 and further comprising:
coupling the control terminal of the pull-up voltage protection terminal to the ground supply terminal when the tri-state buffer is in the low-impedance drive mode; and decoupling the control terminal of the pull-up voltage protection terminal from the ground supply terminal when the tri-state buffer is in the high-impedance tri-state mode.

14. The method of claim 10 and further comprising:
coupling the voltage on the pad terminal to a well terminal of the pad pull-up transistor when the tri-state buffer is in the high-impedance, tri-state mode and the voltage on the pad terminal exceeds the selected voltage level; and decoupling the voltage on the pad terminal from the well terminal of the pad pull-up transistor when the tri-state buffer is in the high-impedance, tri-state mode and the voltage on the pad terminal is less than the selected voltage level.

15. A method of maintaining an output driver stage of a tri-state buffer in a high-impedance tri-state mode when a voltage on a pad terminal of the buffer exceeds a selected voltage, wherein the output driver stage includes a pad pull-up transistor which is coupled to the pad terminal in series with a pull-up protection transistor, the method comprising:

- coupling the voltage on the pad terminal to a well terminal of the pull-up voltage protection transistor through a feedback path comprising first and second P-channel pass-gate transistors, which are coupled in series with one another between the pad terminal and the well terminal and each have a control terminal coupled to the power supply terminal, when the tri-state buffer is in the high-impedance tri-state mode and the voltage on the pad terminal exceeds the selected voltage;
- coupling the voltage on the pad terminal to a control terminal of the pull-up voltage protection transistor through the first P-channel pass-gate transistor, which is coupled in series between the pad terminal and the control terminal of the pull-up voltage protection transistor, when the tri-state buffer is in the high-impedance tri-state mode and the voltage on the pad terminal exceeds the selected voltage;
- coupling the well terminal of the pull-up voltage protection transistor to a power supply terminal when the voltage on the pad terminal is less than the selected voltage; and
- coupling the control terminal of the pull-up voltage protection transistor to a ground supply terminal when the tri-state buffer is in the low-impedance drive mode.

* * * * *